(12) United States Patent
Lee (10) Patent No.: US 8,748,978 B2
(45) Date of Patent: Jun. 10, 2014

(54) SENSE-AMP TRANSISTOR OF SEMICONDUCTOR DEVICE AND METHOD FOR MANUFACTURING THE SAME

(75) Inventor: Sang Ho Lee, Yongin-si (KR)

(73) Assignee: Hynix Semiconductor Inc., Icheon (KR)

( * ) Notice: Subject to any disclaimer, the term of this patent is extended or adjusted under 35 U.S.C. 154(b) by 95 days.

(21) Appl. No.: 13/346,868

(22) Filed: Jan. 10, 2012

(65) Prior Publication Data

US 2012/0286357 A1 Nov. 15, 2012

(30) Foreign Application Priority Data

May 11, 2011 (KR) .......................... 10-2011-0044211

(51) Int. Cl.
*H01L 29/66* (2006.01)

(52) U.S. Cl.
USPC .......................................... 257/331; 257/903

(58) Field of Classification Search
USPC ................... 257/331, 903, 330, 904; 365/182
See application file for complete search history.

(56) References Cited

U.S. PATENT DOCUMENTS

| | | | |
|---|---|---|---|
| 7,575,974 B2 * | 8/2009 | Kim et al. | 438/259 |
| 2012/0286357 A1 * | 11/2012 | Lee | 257/331 |

FOREIGN PATENT DOCUMENTS

| | | |
|---|---|---|
| KR | 10-2005-0097223 A | 10/2005 |
| KR | 10-2007-0036214 A | 4/2007 |
| KR | 10-0732303 B1 | 6/2007 |
| KR | 10-2007-0109253 A | 11/2007 |

\* cited by examiner

*Primary Examiner* — Mark Prenty (57) ABSTRACT

A sense-amp transistor for a semiconductor device and a method for manufacturing the same are disclosed. A sense-amp transistor for a semiconductor device includes a recess array formed in a gate region of a sense-amp, a plurality of buried gates formed in each recess of the recess array so as to form a vertical channel region, and an upper gate configured to form a horizontal channel region in an active region between the buried gates. As a result, the number of additional processes is minimized, and the sensing margin of the sense-amp is guaranteed.

7 Claims, 8 Drawing Sheets

SENSE-AMP TRANSISTOR OF SEMICONDUCTOR DEVICE AND METHOD FOR MANUFACTURING THE SAME

CROSS-REFERENCE TO RELATED APPLICATION

The priority of Korean patent application No. 10-2011-0044211 filed on 11 May 2011, the disclosure of which is hereby incorporated in its entirety by reference, is claimed.

BACKGROUND OF THE INVENTION

Embodiments of the present invention relate to a sense-amp transistor of a semiconductor device, and more particularly to a sense-amp transistor of a semiconductor device and a method for manufacturing the same, which can minimize the number of additional processes by improving a gate structure of the sense-amp transistor, thus increasing a sensing margin.

A sense amplifier (hereinafter referred to as a sense-amp) of a semiconductor device includes a pull-up element using a PMOS transistor and a pull-down element using an NMOS transistor, such that it amplifies a data voltage loaded on a bit line (BL) and a bit line bar (/BL) and outputs the amplified result to a data bus.

Figure 1:
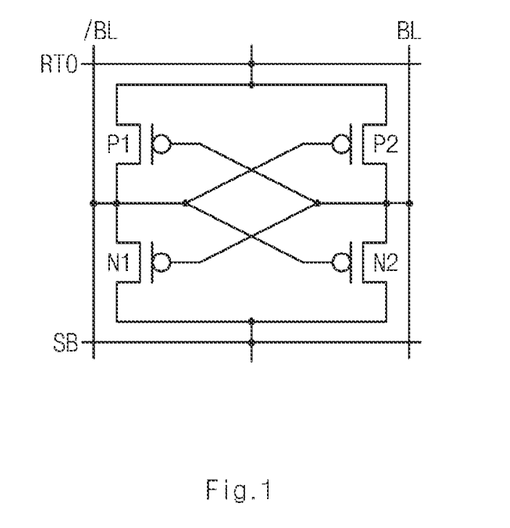
FIG. 1 is a circuit diagram illustrating a pull-up element and a pull-down element of a sense-amp for use in a semiconductor device according to the related art.

FIG. 1 is a circuit diagram illustrating a pull-up element and a pull-down element of a sense-amp for use in a semiconductor device.

Referring to FIG. 1, the sense-amp of the semiconductor device includes PMOS transistors (P1, P2) and NMOS transistors (N1, N2), that are complementarily coupled to one another in the form of a cross-coupled latch between a pull-up voltage (RTO) and a pull-down voltage (SB). A gate of the PMOS transistor P1 and a gate of the NMOS transistor N1 are coupled to a bit line (BL), and a commonly connected drain of the PMOS and NMOS transistors P1 and N1 is coupled to a bit line bar (/BL). A gate of the PMOS transistor P2 and a gate of the NMOS transistor N2 are coupled to the bit line bar (/BL), and a commonly connected drain of the PMOS and NMOS transistors P2 and N2 is coupled to the bit line (BL).

Figure 2:
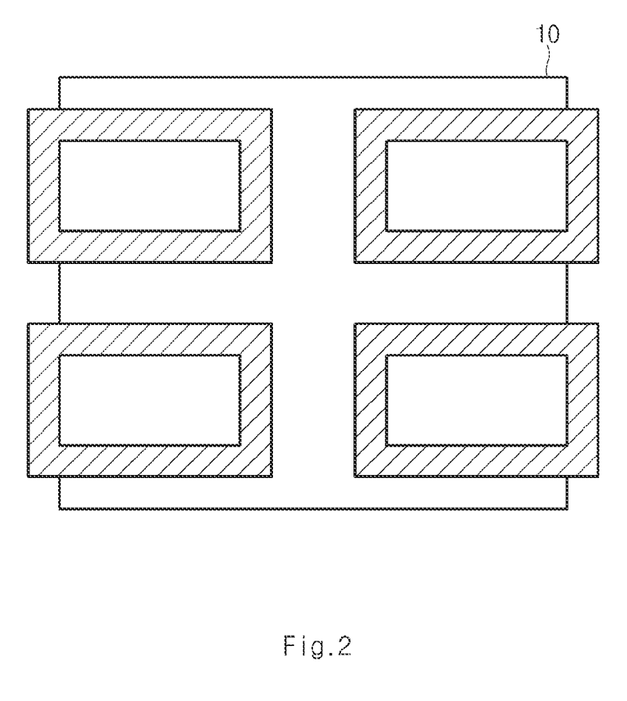
FIG. 2 is a plan view illustrating the sense-amp shown in FIG. 1 according to the related art.

FIG. 2 is a plan view illustrating a sense-amp shown in FIG. 1.

Referring to FIG. 2, an active region 10, in which four transistors are to be formed, is formed in a square shape, and a gate of each transistor constructing the sense-amp is in a ring shape in the active region 10.

Transistors constructing the sense-amp shown in FIG. 2 have been designed to use a recess gate structure to increase a current.

However, recently, as the integration degree of semiconductor devices increase and cell size gradually shrinks, the sense-amp area also shrinks.

However, since a conventional sense-amp allows a gate of each transistor to be configured in the form of a recess gate, and uses a ring-type gate structure as the recess gate, it is difficult to shrink the sense-amp area.

In addition, in the conventional sense-amp a channel was formed only in a recessed channel region, so that it may be difficult to guarantee the sensing margin when the size of the semiconductor device is reduced.

BRIEF SUMMARY OF THE INVENTION

Various embodiments of the present invention are directed to providing a sense-amp transistor of a semiconductor device and a method for manufacturing the same that substantially obviate one or more problems due to limitations and disadvantages of the related art.

An embodiment of the present invention relates to a sense-amp transistor of a semiconductor device and a method for manufacturing the same, which can minimize the number of additional processes by improving a sense-amp transistor structure, resulting in a guarantee of a sensing margin of the sense-amp.

In accordance with an aspect of the present invention, a sense-amp transistor for a semiconductor device includes a recess array formed in a gate region of a sense-amp; a plurality of buried gates formed in each recess of the recess array so as to form a vertical channel region; and an upper gate configured to form a horizontal channel region in an active region between the buried gates.

The buried gate may include metal.

The upper gate may be formed not only over the buried gates but also over the active region between the buried gates in such a manner that the upper gate is electrically coupled to the buried gates. The upper gate may be formed of polysilicon.

The buried gates may be simultaneously formed when a cell-burying gate of a cell region is formed.

The recess formed at both ends of the recess array may be formed to contact an active region and a device isolation film. The recess array may be formed as a line type, and each active region of the sense-amp region includes two recess arrays arranged in parallel to each other.

In accordance with another aspect of the present invention, a method for manufacturing a sense-amp transistor includes forming a recess array in a gate region of a sense-amp in such a manner that recesses are arranged in a line; forming at least one buried gate in the recess; and forming an upper gate not only over the buried gates but also over the active region between the buried gates.

The forming of the recess array may be performed simultaneously while forming a recess for a cell-burying gate in a cell region. The forming of the at least one buried gate may be performed simultaneously while forming the cell-burying gate in the recess for the cell-burying gate The forming of the recess array may include forming a device isolation film defining an active region in a sense-amp region; and forming the plurality of recesses by etching the active region of the buried gate region and the device isolation film, wherein the device isolation film is etched when the recess located at both ends of the recess array is formed.

The forming of the upper gate may include forming a polysilicon layer not only over the active region including an upper part of the buried gate but also over an upper part of the device isolation film; patterning the polysilicon layer using a mask defining the gate region; and implanting $N^+$ ions in the polysilicon layer of an NMOS region from among the gate region and implanting $P^+$ ions in a PMOS region from among the gate region.

The method may further include forming a source and a drain by implanting impurities in an exposed active region located at both sides of the upper gate.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A sense-amp transistor of a semiconductor device and a method for manufacturing the same according to the present invention will hereinafter be described with reference to the appended drawings.

Figure 3:
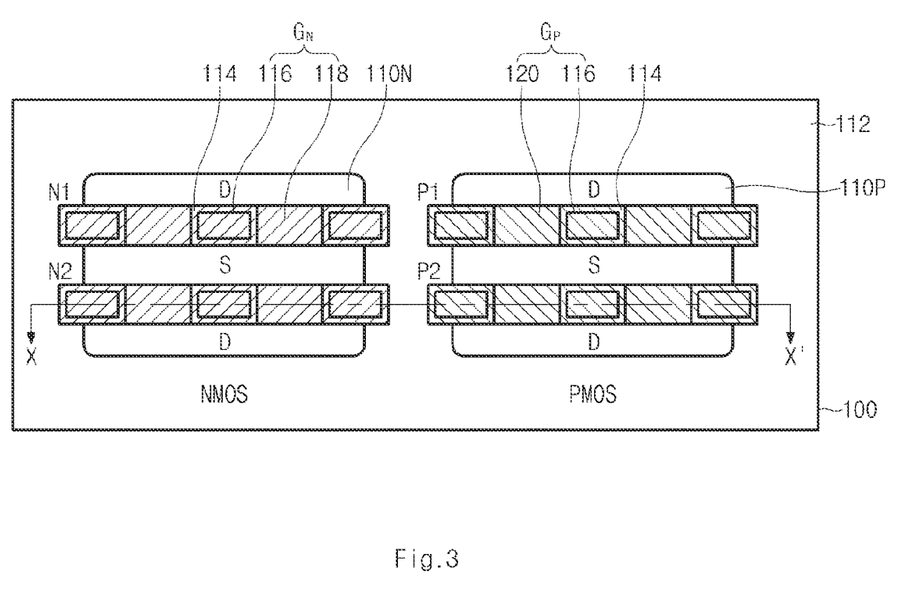
FIG. 3 is a plan view illustrating a sense-amp according to one embodiment of the present invention.
Figure 4:
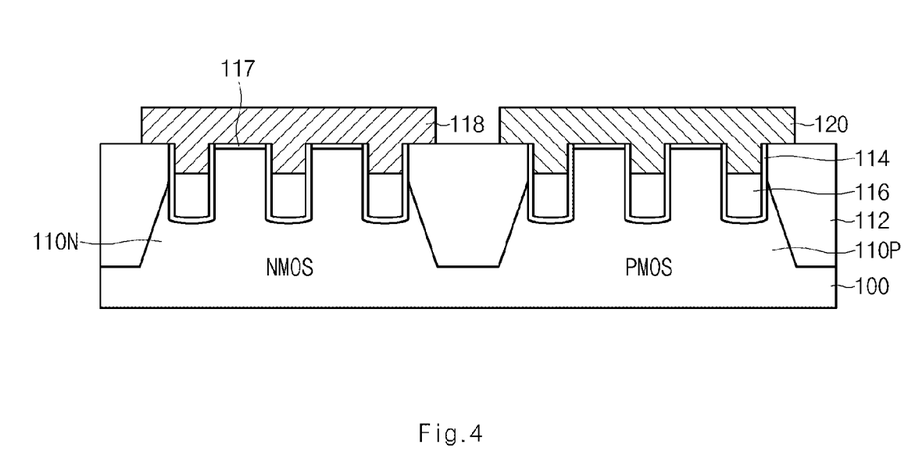
FIG. 4 is a cross-sectional view illustrating a semiconductor device taken along the line X-X' of FIG. 3.

FIG. 3 is a plan view illustrating a sense-amp according to one embodiment of the present invention. FIG. 4 is a cross-sectional view illustrating a semiconductor device taken along the line X-X' of FIG. 3.

Referring to FIGS. 3 and 4, active regions (110N, 110P), defined by a device isolation film 112, are formed over a semiconductor substrate 100 in which a sense-amp is formed in a core region.

NMOS transistors (N1, N2), serving as pull-down transistors, are formed in the active region 110N of the sense-amp, and PMOS transistors (P1, P2), serving as pull-up transistors, are formed in the active region 110P. In an embodiment, gates ($G_N$, $G_P$) of individual transistors include: a buried gate 116 buried in the active regions (110N, 110P) to form a vertical channel region; and upper gates (118, 120) that are formed in a line type, not only over the buried gates 116, but also over the active region between the buried gates 116, so as to be electrically coupled to the buried gates 116. The upper gates 118 and 120 form a horizontal channel region over the active region. In other words, gates ($G_N$, $G_P$) of individual transistors are formed to have a fin gate structure that includes a vertical channel region, which is vertically formed at sidewalls of a recess by the buried gates 116, and a planar channel region, which is horizontally formed over the active region by the upper gates 118 and 120. A gate oxide film 114 is formed at sidewalls of the recess in which the buried gates 116 are formed.

The buried gates 116 are formed when a cell buried gate (not shown) of the cell region is formed. That is, the buried gate 116 of the sense-amp is simultaneously formed through the same process performed to form the cell buried gate of the cell region. Therefore, the buried gates 116 may be formed of the same material (for example, TiN/W) and structure as those of a buried gate (not shown) of the cell region.

Although an embodiment of the present invention has exemplarily disclosed that three buried gates 116 are arranged as a line type in gates ($G_N$, $G_P$) of individual transistors at intervals of a predetermined distance, it should be noted that the number of buried gates 116 is not limited only to 3. However, both ends of each gate ($G_N$ or $G_P$) extend from the active region to the device isolation film.

An upper gate 118 of the NMOS transistor (N1 or N2) is formed of $N^+$ polysilicon, and an upper gate 120 of the PMOS transistor (P1 or P2) is formed of $P^+$ polysilicon. Alternatively, each upper gate 118 or 120 may be formed of specific material, a work function of which is present in a mid-band region located between a valance band (Ev) and a conduction band (Ec). In this case, the upper gate 118 of the NMOS region and the upper gate 120 of the PMOS region may be formed at the same time. A gate oxide film (117) is formed between the active region 110N and the upper gate 118, and between the active region 110P and the upper gate 120, respectively.

Impurities are implanted in the active regions located at both sides of each gate ($G_N$ or $G_P$) such that a source/drain region is formed. A plurality of contacts (not shown) for connecting the PMOS transistors (P1, P2) to the NMOS transistors (N1, N2) are formed over the source/drain region and the gates ($G_N$, $G_P$), as shown in FIG. 1.

FIGS. 5 to 8 are cross-sectional views illustrating a method for manufacturing the semiconductor device shown in FIG. 4.

Figure 5:
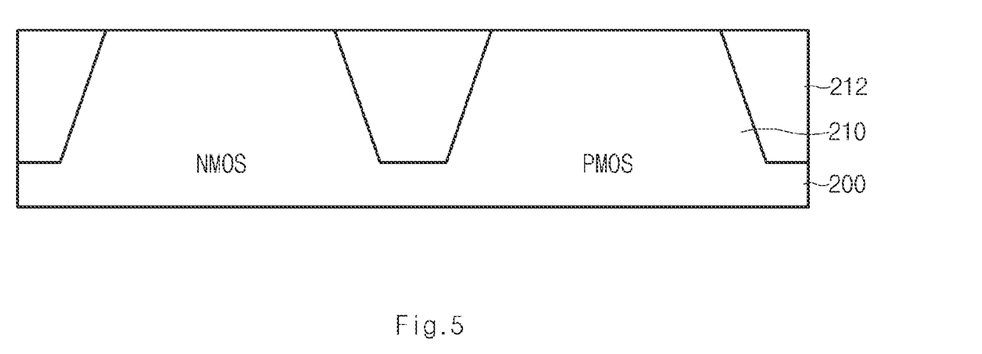
FIGS. 5 to 8 are cross-sectional views illustrating a method for manufacturing the semiconductor device shown in FIG. 4.

Referring to FIG. 5, a pad oxide film (not shown) and a pad nitride film (not shown) are formed over the semiconductor substrate 200 in a core region, and a photoresist film (not shown) is formed over the pad nitride film. In an embodiment, the pad oxide film is formed to prevent stress by the pad nitride film from being applied to the semiconductor substrate.

Subsequently, an exposure and development process is performed on the photoresist film such that a photoresist pattern (not shown) for defining the active region 210 is formed. The pad nitride film, the pad oxide film, and the semiconductor substrate of the device isolation region are sequentially etched using the photoresist pattern as an etch mask, such that a trench (not shown), a pad nitride film pattern (not shown), and a pad oxide film pattern (not shown) are formed. Subsequently, an oxide film (not shown) is formed at inner walls of the trench through an oxidation process. In an embodiment, after formation of the trench, the oxide film is formed to reduce a defective lattice that may occur over the exposed semiconductor substrate.

Thereafter, a liner nitride film (not shown) and a liner oxide film (not shown) are formed at sidewalls of the trench. The liner nitride film may be formed not only to prevent oxidation of inner walls of the trench but also to alleviate stress that is likely to occur in a subsequent process. In addition, the liner oxide film may be formed to prevent stress or the like from being directly applied to the trench when an insulation material is deposited in the trench, and may also be formed to reduce unevenness caused by a difference in deposition speed between the exposed semiconductor substrate and the pad nitride film pattern.

After that, an insulation material for device isolation is formed to fill the trench. The insulation material for device isolation may be formed of an oxide film. For example, the insulation material for device isolation may be formed of a Silicon On Dielectric (SOD) or a High Density Plasma (HDP).

A Chemical Mechanical Polishing (CMP) process is performed on the insulation material for device isolation until the pad nitride film pattern is exposed, such that the insulation material for device isolation is planarized. As a result, a device isolation film 212 for defining a rectangular active region 210, such as the active region 110N or 110P shown in FIG. 3, is formed.

Figure 6:
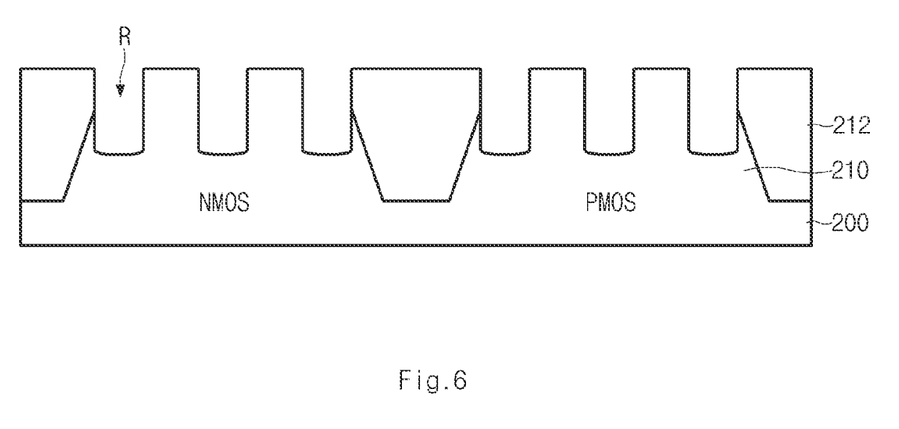

Referring to FIG. 6, after the pad nitride film pattern is removed, a pad oxide film (not shown) and a hard mask layer (not shown) are formed over the active region 210 and the device isolation film 212. In an embodiment, the hard mask layer may be formed in a stacked structure of a nitride film, an ACL (a-Carbon Layer), and a SiON film.

After a photoresist film (not shown) is formed over the hard mask layer, an exposure and development process is performed on the photoresist film, such that a photoresist pattern (not shown) for defining the buried gate region is formed.

Subsequently, the hard mask layer is etched using the photoresist pattern as an etch mask such that a hard mask pattern is formed. The active region 210 and the device isolation film 212 are etched using the hard mask pattern as an etch mask, such that a recess array is formed. In the recess array, recesses (R) of predetermined depths (1000 Å-2000 Å) are arranged in a line. In a recess array according to this embodiment, three recesses (R) are spaced apart from one another at a predetermined interval as a line type, and two recess arrays are formed to be parallel to each other in each active region 210. In other words, one recess array may correspond to one gate ($G_N$ or $G_P$). In an embodiment, both ends of each recess array may extend from the active region 210 to the device isolation film 212.

After that, the hard mask pattern and the gate pad oxide film are removed.

Figure 7:
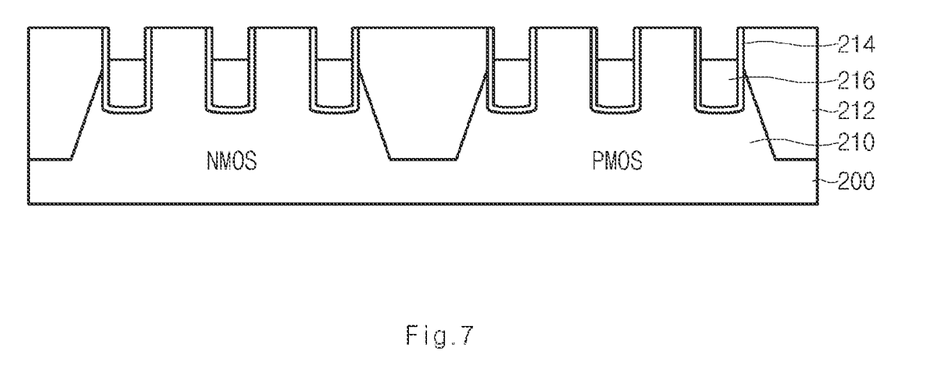

Referring to FIG. 7, a gate oxide film (not shown) is formed over the exposed semiconductor substrate. The gate oxide film is formed to protect the surface of the semiconductor substrate. For example, the gate oxide film may be formed, by performing a CVD method, on a high-K material such as SiO, ONO, HfO2x, ZrO, etc., or PZT material. The gate oxide film may also be formed by heating the semiconductor substrate in a furnace. Alternatively, after the high-K material, such as Zr or HF, is deposited over the semiconductor substrate using an ALD process, the high-K material is then naturally oxidized, resulting in formation of a gate oxide film.

After the gate electrode material is buried in the recess, the gate electrode material is etched and planarized until the active region 210 is exposed. In an embodiment, the gate oxide film formed over the active region 210 is also etched such that the gate oxide film 214 remains only in the recess. The gate electrode material buried in the recess is etched back, such that the resultant gate electrode material, having a predetermined height, remains only at a lower portion of the recess, resulting in formation of the buried gate 216. For example, the gate electrode material may be formed of a metal (e.g., TiN/W).

The above-mentioned processes are performed along with a process for forming a buried cell gate in the cell region. That is, the recess array may be formed while simultaneously forming a recess for the buried cell gate, and the buried gate in the recess array (also referred to as a lower sense-amp gate) may be formed when forming the buried cell gate in the above recess.

Figure 8:
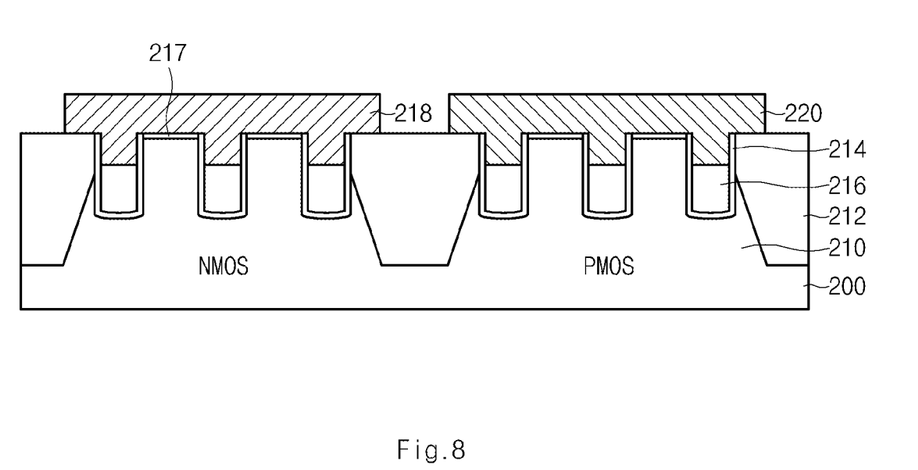

Referring to FIG. 8, a gate oxide film (217) is formed over the exposed active region 210.

Subsequently, a polysilicon layer (not shown) is formed over the active region 210 of the sense-amp region and the device isolation film 212 of the sense-amp region in such a manner that the recess is filled with the polysilicon layer. After that, polysilicon layers of the NMOS and PMOS regions are patterned using a mask defining an upper sense-amp gate as an etch mask.

$N^+$ ions are implanted in the polysilicon layer of the patterned NMOS region, and $P^+$ ions are implanted in the polysilicon layer of the patterned PMOS region to form the upper sense-amp gates (218, 220), respectively. Each of the upper sense-amp gates (218, 220) extends laterally such that they commonly couple a plurality of lower sense-amp gates (216). As a result, the buried type lower sense-amp gates 216 and the planar type upper sense-amp gates (218, 220) are coupled to each other and form fin-shaped sense-amp gates.

In this way, the fin-shaped sense-amp gates (see $G_N$, $G_P$ of FIG. 3) of the sense-amp region are brought into contact with the surface of the active region 210. Thus, transistors (see N1, N2, P1, P2 of FIG. 3) constructing the sense-amp are formed to have both a vertical channel region and a horizontal channel region, resulting in an increased sensing margin of the sense-amp. Moreover, a plurality of recesses is formed in one gate region so as to form a plurality of vertical channel regions, such that more current can flow in a given area, thus allowing reduction of the layout area of the sense-amp.

After that, impurities are implanted in the active regions located at both sides of the gates ($G_N$, $G_P$) such that a source and a drain are formed, and contacts (not shown) for circuit connection shown in FIG. 1 are formed. The process for forming the source/drain region and the contact may be performed in the same manner as in the related art. As such, a detailed description thereof will be omitted for convenience of description and better understanding of the present invention.

Although the present invention has been disclosed by referring to the above-mentioned embodiments, it should be noted that the aforementioned embodiments have been disclosed for only illustrative purposes, and those skilled in the art will appreciate that various modifications, additions and substitutions are possible, without departing from the scope and spirit of the invention as disclosed in the accompanying claims. Thus, it is intended that the present invention covers modifications and variations of the present invention provided they come within the scope of the appended claims and their equivalents.

As is apparent from the above description, the sense-amp transistor of a semiconductor device and a method for manufacturing the same according to embodiments of the present invention can minimize the number of additional processes and can further improve sense-amp transistor performance. Also, the sensing margin of the sense-amp can be improved.

In addition, according to embodiments of the present invention, more current can flow in one gate region, such that the layout area of the sense-amp can be greatly reduced.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A sense-amp transistor for a semiconductor device comprising:
   a recess array formed in a gate region of a sense-amp;
   a plurality of buried gates formed in each recess of the recess array so as to form a vertical channel region; and
   an upper gate coupled to the plurality of buried gates to form a horizontal channel region,
   wherein the vertical channel region is coupled to the horizontal channel region,
   wherein the recess array is formed as a line type, and each active region of the sense-amp region includes two or more recess arrays arranged in parallel to each other.

2. The sense-amp transistor according to claim 1, wherein the buried gates include metal.

3. The sense-amp transistor according to claim 1, wherein the upper gate is formed over the buried gates and an active region between the buried gates in such a manner that the upper gate is coupled to the buried gates.

4. The sense-amp transistor according to claim 1, wherein the upper gate is formed of polysilicon.

5. The sense-amp transistor according to claim 1, wherein the buried gates are simultaneously formed when a buried cell gate is formed in a cell region.

6. The sense-amp transistor according to claim 1, wherein an end of the recess array extends from an active region to a device isolation film.

7. A sense-amp transistor for a semiconductor device comprising:
- a plurality of buried type lower sense-amp gates; and
- a planar type upper sense-amp gate coupled to the plurality of buried type lower sense-amp gates,
- wherein the plurality of buried type lower sense-amp gates and the planar type upper sense-amp gate combine to form a fin-shaped sense-amp gate,
- wherein each active region of a sense-amp region includes the planar type upper sense-amp gate arranged in parallel to each other,
- wherein the plurality of lower sense-amp gates in a sense-amp region are each coupled to a plurality of buried cell gates in a cell region.

* * * * *